United States Patent
Warren et al.

(10) Patent No.: US 9,726,777 B2
(45) Date of Patent: Aug. 8, 2017

(54) CAPACITIVE PROBE FABRICATING FROM SPRAY DEPOSITION

(71) Applicant: United Technologies Corporation, Hartford, CT (US)

(72) Inventors: Eli Cole Warren, Wethersfield, CT (US); Jerusalem Negash, Wethersfield, CT (US)

(73) Assignee: United Technologies Corporation, Farmington, CT (US)

( * ) Notice: Subject to any disclaimer, the term of this patent is extended or adjusted under 35 U.S.C. 154(b) by 17 days.

(21) Appl. No.: 14/761,994

(22) PCT Filed: Jan. 23, 2013

(86) PCT No.: PCT/US2013/022686
§ 371 (c)(1),
(2) Date: Jul. 20, 2015

(87) PCT Pub. No.: WO2014/116211
PCT Pub. Date: Jul. 31, 2014

(65) Prior Publication Data
US 2015/0316677 A1     Nov. 5, 2015

(51) Int. Cl.
*G01R 27/26* (2006.01)
*G01B 7/14* (2006.01)
(Continued)

(52) U.S. Cl.
CPC .............. *G01V 3/088* (2013.01); *B05D 1/08* (2013.01); *B05D 1/32* (2013.01); *B05D 5/02* (2013.01);
(Continued)

(58) Field of Classification Search
CPC .............. G01R 33/1223; G01R 35/005; G01R 27/2605; G01R 15/16; G01R 33/02;
(Continued)

(56) References Cited

U.S. PATENT DOCUMENTS 4,016,490 A    4/1977    Weckenmann et al.
4,122,708 A   10/1978    Maier
(Continued)

FOREIGN PATENT DOCUMENTS

EP    0806680 A2    11/1997
EP    1811666 A1     7/2007
WO    2011/112812 A2   9/2011

OTHER PUBLICATIONS

International Preliminary Report on Patentability for International Application No. PCT/US2013/022686 mailed Aug. 6, 2015.
(Continued)

*Primary Examiner* — Jermele M Hollington
*Assistant Examiner* — Taqi Nasir
(74) *Attorney, Agent, or Firm* — Carlson, Gaskey & Olds, P.C.

(57) ABSTRACT

A proximity sensor includes a lead supported on an outer surface of a case structure and a sensor wire that extends from the lead and through an opening in the case structure. The sensor is formed by applying alternating layers of electrically conductive and non-conductive materials in a non-cured state. A base non-conductive layer is applied to an inner surface of the case structure around the sensor wire in a non-cured state. Once cured, a conductive layer is deposited onto the base non-conductive layer and encapsulates the sensor wire. A cover non-conductive layer is then deposited over portions of the conductive layer to insulate the conductive layer. Portions of the non-conductive layer are then removed such that an area of the conductive layer is exposed to define a sensor area.

16 Claims, 9 Drawing Sheets

(51) Int. Cl.
| | |
|---|---|
| *G01V 3/08* | (2006.01) |
| *B05D 1/08* | (2006.01) |
| *B05D 1/32* | (2006.01) |
| *B05D 5/02* | (2006.01) |
| *B32B 37/24* | (2006.01) |
| *B23K 1/00* | (2006.01) |
| *B32B 38/04* | (2006.01) |
| *B23K 31/02* | (2006.01) |
| *H05K 3/10* | (2006.01) |
| *G01V 13/00* | (2006.01) |
| *H03K 17/955* | (2006.01) |
| *G01B 7/16* | (2006.01) |

(52) U.S. Cl.
CPC ............ *B23K 1/0016* (2013.01); *B23K 31/02* (2013.01); *B32B 37/24* (2013.01); *B32B 38/04* (2013.01); *G01V 13/00* (2013.01); *H03K 17/955* (2013.01); *H05K 3/10* (2013.01); *B32B 2037/243* (2013.01); *B32B 2038/047* (2013.01); *B32B 2307/202* (2013.01); *B32B 2457/00* (2013.01); *G01B 7/22* (2013.01); *H03K 2217/960755* (2013.01); *Y10T 29/49156* (2015.01); *Y10T 156/1056* (2015.01)

(58) Field of Classification Search
CPC  G01R 33/0206; G01R 33/09; G01R 33/1276; G01R 19/0084; G01R 1/30; G01R 27/26; G01R 33/0011; G01R 33/0029; G01R 33/028; G01R 33/093; G01R 15/06; G01R 19/0092; G01R 1/04; H05K 3/30; H05K 429/25; H05K 29/289; H05K 257/81
USPC ....... 324/658, 220, 234, 239, 241, 242, 243, 324/245–247, 530, 750.17, 754.28, 686
See application file for complete search history.

(56) References Cited

U.S. PATENT DOCUMENTS

| | | | |
|---|---|---|---|
| 4,818,948 A | 4/1989 | Dooley | |
| 5,117,637 A * | 6/1992 | Howell | F23R 3/283 60/740 |
| 5,818,242 A * | 10/1998 | Grzybowski | F01D 11/025 324/642 |
| 6,380,750 B1 | 4/2002 | Schenck, Jr. et al. | |
| 6,692,222 B2 | 2/2004 | Prinz et al. | |
| 6,773,678 B2 | 8/2004 | Cummings et al. | |
| 7,775,107 B2 | 8/2010 | Holmquist | |
| 2003/0180445 A1 | 9/2003 | Wang et al. | |
| 2004/0202886 A1* | 10/2004 | Subramanian | C23C 4/18 428/632 |
| 2005/0072163 A1* | 4/2005 | Wells | F02C 7/264 60/796 |
| 2009/0001999 A1* | 1/2009 | Douglas | H03K 17/955 324/688 |
| 2010/0097079 A1* | 4/2010 | Sheikman | G01B 7/14 324/686 |
| 2010/0117859 A1* | 5/2010 | Mitchell | F01D 17/02 340/870.16 |
| 2011/0061810 A1* | 3/2011 | Ganguly | H01L 21/0223 156/345.27 |
| 2011/0188994 A1 | 8/2011 | Shang et al. | |
| 2012/0166102 A1* | 6/2012 | Nieters | G01M 5/0016 702/34 |
| 2014/0035231 A1* | 2/2014 | Singh | F16J 15/442 277/301 |

OTHER PUBLICATIONS

International Search Report and Written Opinion for International Application No. PCT/US2013/022686 mailed Apr. 1, 2013.
European Search Report for EP Application No. 13872564.3 dated Jan. 19, 2016.

\* cited by examiner

CAPACITIVE PROBE FABRICATING FROM SPRAY DEPOSITION

BACKGROUND

A gas turbine engine typically includes a fan section, a compressor section, a combustor section and a turbine section. Air entering the compressor section is compressed and delivered into the combustion section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

Measurement and observation of components during operation of a gas turbine engine can be useful in improving overall operational efficiency. Probes are utilized in tip-timing systems that observe and measure arrival times of rotor, compressor or fan blades. One type of probe utilizes an optical fiber mounted within a static structure proximate the rotating blade. Such mounting locations expose the optical fiber to extreme temperature environment within the engine. Capacitor type sensors utilize electrically conductive materials adhered to an inner surface of case. Sensors that require an adhesive or an epoxy for mounting are susceptible to failure due to exposure to extreme temperatures encountered during operation.

It is therefore desirable to design and develop simplified mounting structures for probes and or other optical components that are compatible at high temperature and extreme environments.

SUMMARY

A method of fabricating a proximity sensor according to an exemplary embodiment of this disclosure, among other possible things includes extending a sensor wire through an opening in a substrate, depositing a base electrically non-conductive layer with a cure in place process onto the substrate and around the sensor wire, and encapsulating the sensor wire within an electrically conductive layer deposited onto the base non-conductive layer with a cure in-place process.

In a further embodiment of the foregoing method, encapsulating the sensor wire within a conductive layer includes depositing a first conductive layer onto the base non-conductive layer, adhering the sensor wire to the first conductive layer and depositing a second conductive layer over the first conductive layer and the sensor wire.

In a further embodiment of any of the foregoing methods, includes applying a cover non-conductive layer over the conductive layer.

In a further embodiment of any of the foregoing methods, includes the step of masking an area for the base non-conductive layer and depositing non-conductive material within the masked area.

In a further embodiment of any of the foregoing methods, includes the step of defining a sensor area with a mask and depositing the conductive layer encapsulating the sensor wire within the sensor area.

In a further embodiment of any of the foregoing methods, includes mounting a lead to the substrate and extending the sensor wire from the lead through the substrate.

A method of mounting a proximity sensor within a gas turbine engine according to an exemplary embodiment of this disclosure, among other possible things includes forming an opening within a case structure proximate a rotating structure, extending a sensor wire through the opening in the case structure, depositing a base non-conductive layer with a thermal spray process onto an inner surface of the case structure around the sensor wire, encapsulating the sensor wire within a conductive layer deposited onto the base non-conductive layer with a thermal spraying process, depositing a non-conductive abraidable layer over the conductive layer, and removing a portion of the abraidable layer to expose the conductive layer.

In a further embodiment of the foregoing method, includes depositing a cover non-conductive layer over the conductive layer prior to depositing the abraidable layer and removing both the cover non-conductive layer and the abraidable layer to expose the conductive layer.

In a further embodiment of any of the foregoing methods, encapsulating the sensor wire within a conductive layer comprises depositing a first conductive layer onto the base non-conductive layer, adhering the sensor wire to the first conductive layer and depositing a second conductive layer over the first conductive layer and the sensor wire.

In a further embodiment of any of the foregoing methods, includes removing a portion of the abraidable layer to define a shape of the proximity sensor.

In a further embodiment of any of the foregoing methods, the thermal spraying process comprises a plasma deposition spray process.

In a further embodiment of any of the foregoing methods, includes mounting a lead within a ferrule and mounting the ferrule to the case structure proximate the opening.

In a further embodiment of any of the foregoing methods, includes brazing the lead to the ferrule and welding the ferrule to the case structure.

A proximity sensor according to an exemplary embodiment of this disclosure, among other possible things includes a lead supported on an outer surface of a case structure, a sensor wire extending from the lead and through an opening in the case structure, a base non-conductive layer thermally applied to an inner surface of the case structure around the sensor wire, a conductive layer thermally deposited onto the base non-conductive layer and encapsulating the sensor wire, and a cover non-conductive layer thermally deposited over portions of the conductive layer such that an area of the conductive layer is exposed to define a sensor area.

In a further embodiment of the foregoing proximity sensor, the conductive layer includes a first conductive layer applied to the base non-conductive layer. The sensor wire is adhered to the first conductive layer and a second conductive layer encapsulates the sensor wire adhered to the first conductive layer.

In a further embodiment of any of the foregoing proximity sensors, the sensor wire is in electrical conductive contact with the conductive layer.

In a further embodiment of any of the foregoing proximity sensors, includes a ferrule supporting the lead and attached to the case structure.

In a further embodiment of any of the foregoing proximity sensors, includes an abraidable layer deposited over the cover non-conductive layer and the conductive layer is exposed and countersunk relative to the abraidable area.

Although the different examples have the specific components shown in the illustrations, embodiments of this disclosure are not limited to those particular combinations. It is possible to use some of the components or features from one of the examples in combination with features or components from another one of the examples.

These and other features disclosed herein can be best understood from the following specification and drawings, the following of which is a brief description.

DETAILED DESCRIPTION

Figure 1:
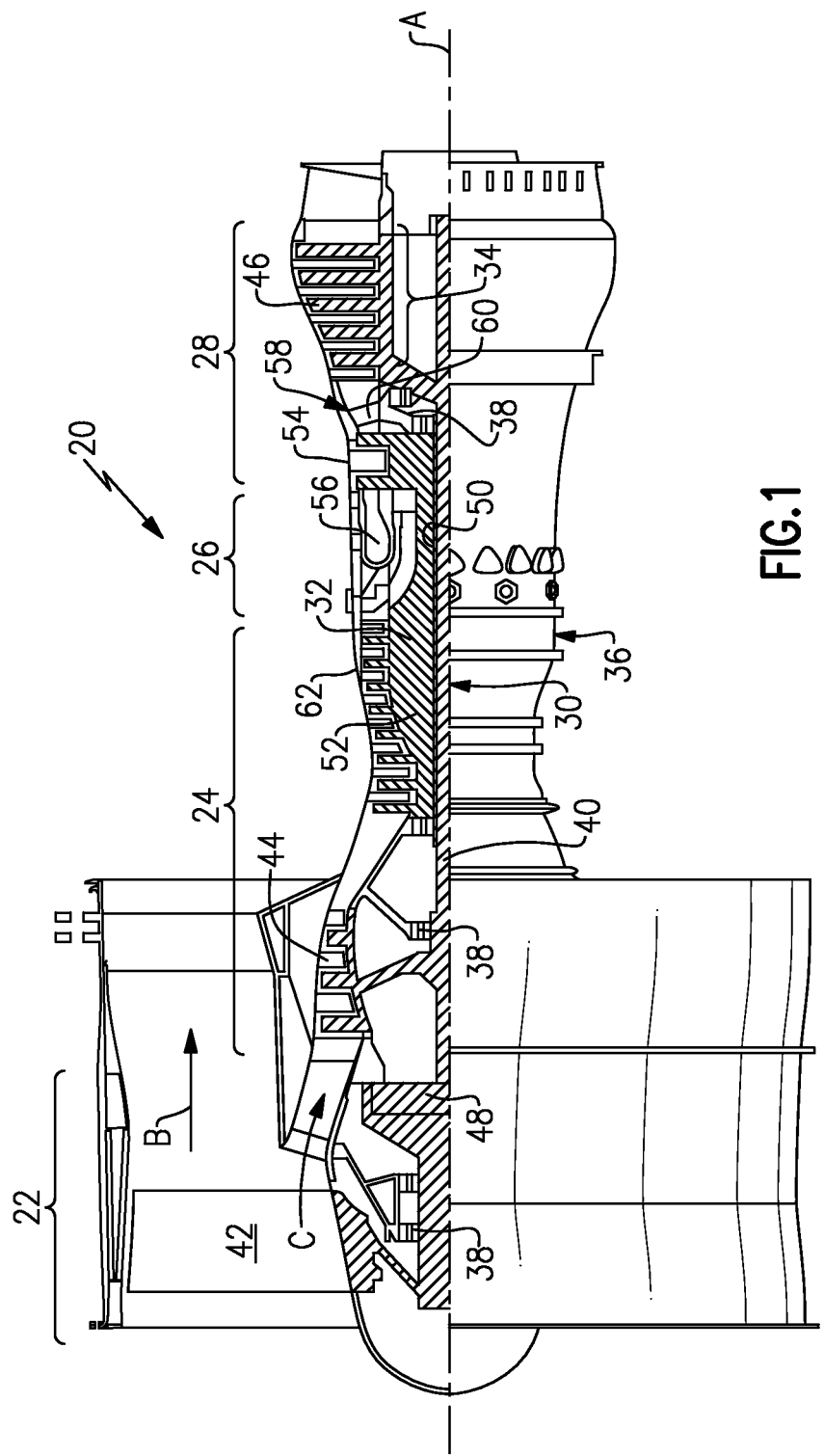
FIG. 1 is a schematic view of an example gas turbine engine.

FIG. 1 schematically illustrates an example gas turbine engine 20 that includes a fan section 22, a compressor section 24, a combustor section 26 and a turbine section 28. Alternative engines might include an augmenter section (not shown) among other systems or features. The fan section 22 drives air along a bypass flow path B while the compressor section 24 draws air in along a core flow path C where air is compressed and communicated to a combustor section 26. In the combustor section 26, air is mixed with fuel and ignited to generate a high pressure exhaust gas stream that expands through the turbine section 28 where energy is extracted and utilized to drive the fan section 22 and the compressor section 24.

Although the disclosed non-limiting embodiment depicts a turbofan gas turbine engine, it should be understood that the concepts described herein are not limited to use with turbofans as the teachings may be applied to other types of turbine engines; for example a turbine engine including a three-spool architecture in which three spools concentrically rotate about a common axis and where a low spool enables a low pressure turbine to drive a fan via a gearbox, an intermediate spool that enables an intermediate pressure turbine to drive a first compressor of the compressor section, and a high spool that enables a high pressure turbine to drive a high pressure compressor of the compressor section.

The example engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided.

The low speed spool 30 generally includes an inner shaft 40 that connects a fan 42 and a low pressure (or first) compressor section 44 to a low pressure (or first) turbine section 46. The inner shaft 40 drives the fan 42 through a speed change device, such as a geared architecture 48, to drive the fan 42 at a lower speed than the low speed spool 30. The high-speed spool 32 includes an outer shaft 50 that interconnects a high pressure (or second) compressor section 52 and a high pressure (or second) turbine section 54. The inner shaft 40 and the outer shaft 50 are concentric and rotate via the bearing systems 38 about the engine central longitudinal axis A.

A combustor 56 is arranged between the high pressure compressor 52 and the high pressure turbine 54. In one example, the high pressure turbine 54 includes at least two stages to provide a double stage high pressure turbine 54. In another example, the high pressure turbine 54 includes only a single stage. As used herein, a "high pressure" compressor or turbine experiences a higher pressure than a corresponding "low pressure" compressor or turbine.

The example low pressure turbine 46 has a pressure ratio that is greater than about 5. The pressure ratio of the example low pressure turbine 46 is measured prior to an inlet of the low pressure turbine 46 as related to the pressure measured at the outlet of the low pressure turbine 46 prior to an exhaust nozzle.

A mid-turbine frame 58 of the engine static structure 36 is arranged generally between the high pressure turbine 54 and the low pressure turbine 46. The mid-turbine frame 58 further supports bearing systems 38 in the turbine section 28 as well as setting airflow entering the low pressure turbine 46.

Airflow through the core airflow path C is compressed by the low pressure compressor 44 then by the high pressure compressor 52 mixed with fuel and ignited in the combustor 56 to produce high speed exhaust gases that are then expanded through the high pressure turbine 54 and low pressure turbine 46. The mid-turbine frame 58 includes vanes 60, which are in the core airflow path and function as an inlet guide vane for the low pressure turbine 46. Utilizing the vane 60 of the mid-turbine frame 58 as the inlet guide vane for low pressure turbine 46 decreases the length of the low pressure turbine 46 without increasing the axial length of the mid-turbine frame 58. Reducing or eliminating the number of vanes in the low pressure turbine 46 shortens the axial length of the turbine section 28. Thus, the compactness of the gas turbine engine 20 is increased and a higher power density may be achieved.

The disclosed gas turbine engine 20 in one example is a high-bypass geared aircraft engine. In a further example, the gas turbine engine 20 includes a bypass ratio greater than about six (6), with an example embodiment being greater than about ten (10). The example geared architecture 48 is an epicyclical gear train, such as a planetary gear system, star gear system or other known gear system, with a gear reduction ratio of greater than about 2.3.

In one disclosed embodiment, the gas turbine engine 20 includes a bypass ratio greater than about ten (10:1) and the fan diameter is significantly larger than an outer diameter of the low pressure compressor 44. It should be understood, however, that the above parameters are only exemplary of one embodiment of a gas turbine engine including a geared architecture and that the present disclosure is applicable to other gas turbine engines.

A significant amount of thrust is provided by the bypass flow B due to the high bypass ratio. The fan section 22 of the engine 20 is designed for a particular flight condition— typically cruise at about 0.8 Mach and about 35,000 feet. The flight condition of 0.8 Mach and 35,000 ft., with the engine at its best fuel consumption—also known as "bucket cruise Thrust Specific Fuel Consumption ('TSFC')"—is the industry standard parameter of pound-mass (lbm) of fuel per hour being burned divided by pound-force (lbf) of thrust the engine produces at that minimum point.

"Low fan pressure ratio" is the pressure ratio across the fan blade alone, without a Fan Exit Guide Vane ("FEGV") system. The low fan pressure ratio as disclosed herein according to one non-limiting embodiment is less than about 1.50. In another non-limiting embodiment the low fan pressure ratio is less than about 1.45.

"Low corrected fan tip speed" is the actual fan tip speed in ft/sec divided by an industry standard temperature correction of $[(Tram\ °R)/(518.7°\ R)]^{0.5}$. The "Low corrected fan tip speed", as disclosed herein according to one non-limiting embodiment, is less than about 1150 ft/second.

The example gas turbine engine includes the fan 42 that comprises in one non-limiting embodiment less than about 26 fan blades. In another non-limiting embodiment, the fan section 22 includes less than about 20 fan blades. Moreover, in one disclosed embodiment the low pressure turbine 46 includes no more than about 6 turbine rotors schematically indicated at 34. In another non-limiting example embodiment the low pressure turbine 46 includes about 3 turbine rotors. A ratio between the number of fan blades 42 and the number of low pressure turbine rotors is between about 3.3 and about 8.6. The example low pressure turbine 46 provides the driving power to rotate the fan section 22 and therefore the relationship between the number of turbine rotors 34 in the low pressure turbine 46 and the number of blades 42 in the fan section 22 disclose an example gas turbine engine 20 with increased power transfer efficiency.

Figure 2:
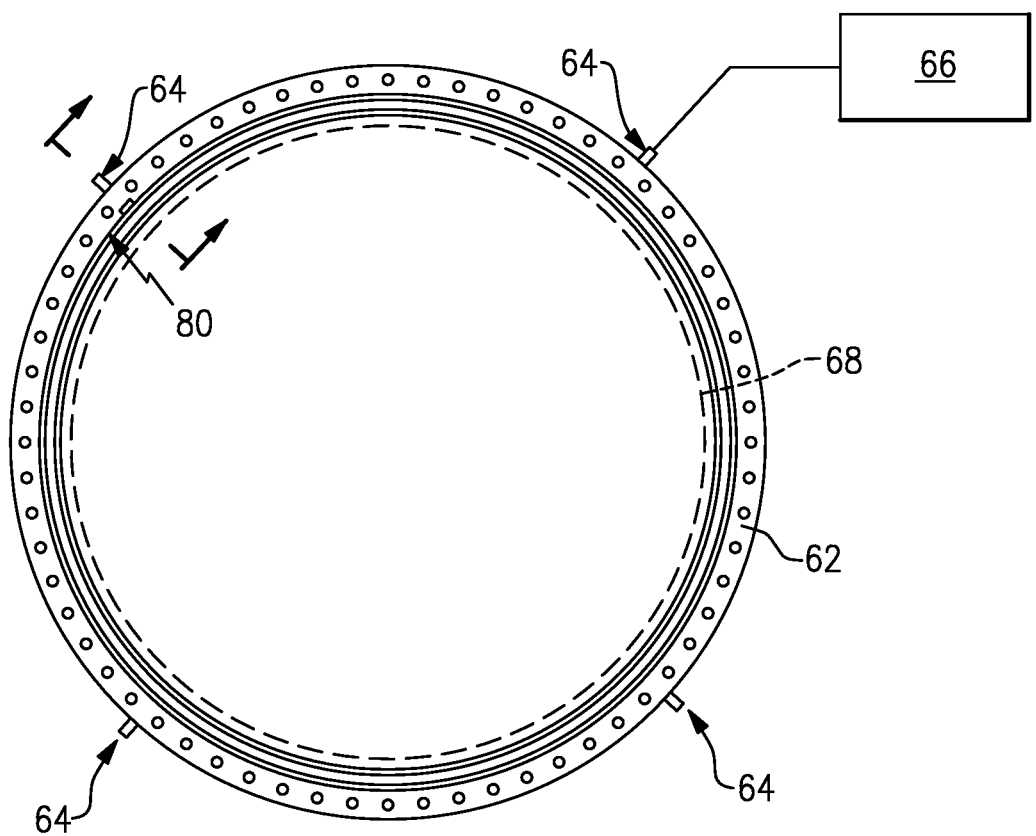
FIG. 2 is a schematic view of an example engine case structure including proximity sensors.
Figure 3:
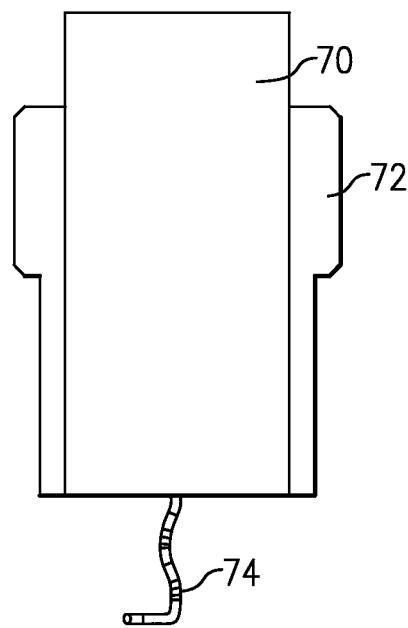
FIG. 3 is a cross section of example proximity sensor.
Figure 4:
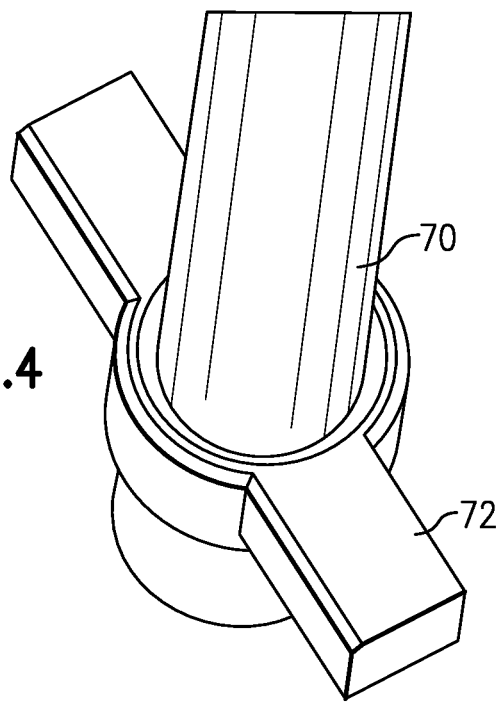
FIG. 4 is a perspective view of an example lead of a proximity sensor.
Figure 5:
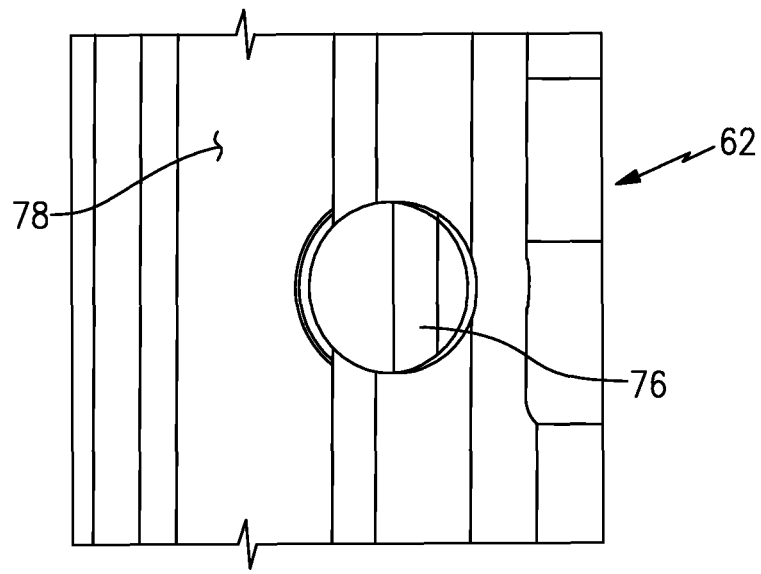
FIG. 5 is a top view of an example case structure.
Figure 6:
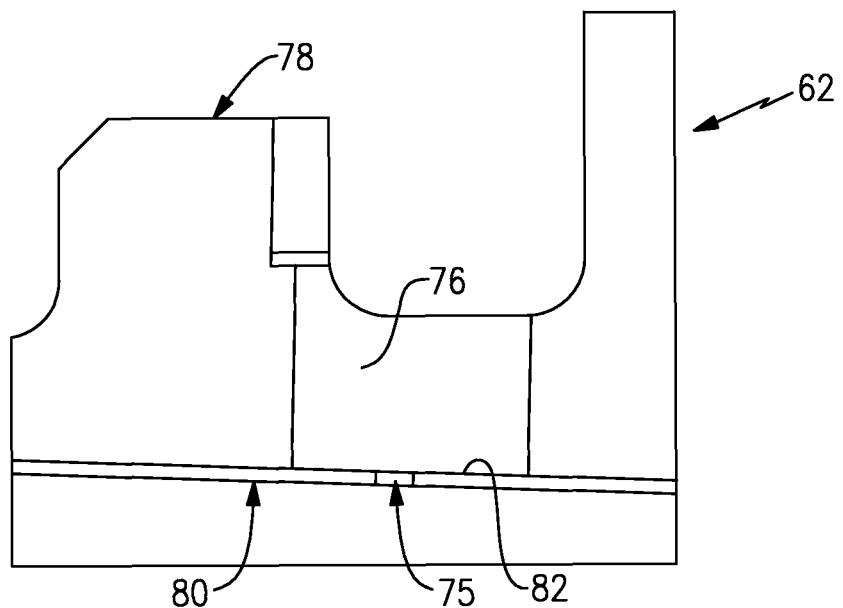
FIG. 6 is a cross-section of an opening through an example case structure.

Referring to FIG. 2 with continued reference to FIG. 1, the example gas turbine engine 20 includes a case structure 62. In this example, the case structure 62 is a portion of the compressor case and includes a plurality of proximity sensors 64 that are utilized to detect the presence and clearance between tips of a plurality of rotating blades moving along the path generally indicated at 68. Each of the proximity sensors 64 are disposed on an inner surface 80 of the case structure 62 and communicate with a controller 66 to provide an indication of a relative position between the static case structure 62 and the tips of the rotating blades along the path 68.

Referring to FIGS. 3-6 with continued reference to FIG. 2, each of the example proximity sensors 64 are installed within the case structure 62 using a thermal spray deposition process. The thermal spray process is utilized to form layers of electrically conductive and electrically non-conductive material directly onto the case structure 62. Each of the layers are applied in a non-cured state and cured in place once applied to the inner surface 80 of the case structure 62. The example layers forming the sensors 64 can include coating, plating or thermal spray processes.

The example sensor assembly 64 is formed utilizing a thermal spray process after a lead 70 mounted within a ferrule 72 is attached to the case structure 62. In this example, the lead 70 is mounted within a ferrule 72. The ferrule 72 is a structure formed of a material compatible with a welding process for attachment to the case structure 62. The lead 70 is adhered within the ferrule 72 through a brazing process or other processes that is compatible with the material of the lead 70. The example ferrule 72 including the lead is then welded to the case 62 to attach and secure the lead 70 to the case structure 62.

The case structure 62 includes an opening 76 for receiving the lead 70. In this example the opening 76 includes a bottom surface 82. The opening 76 is formed through an outer surface 78 of the case 62 and extends downward toward the inner bottom surface 82. The bottom surface 82 includes a second smaller opening 75 for a sensor wire 74 that extends from the lead 70 to extend through the case structure 62.

The opening 76 is sized to accept the ferrule 72 and the lead 70 downward into the cavity formed by the opening 76 such that the lead 70 will bottom out on the bottom surface 82 of the opening 76.

Figure 7:
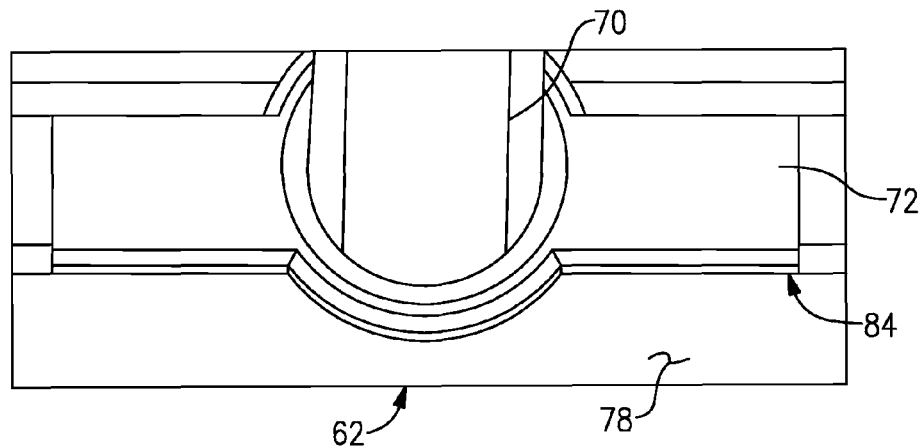
FIG. 7 is a perspective view of the sensor assembly attached to the example case structure.
Figure 8:
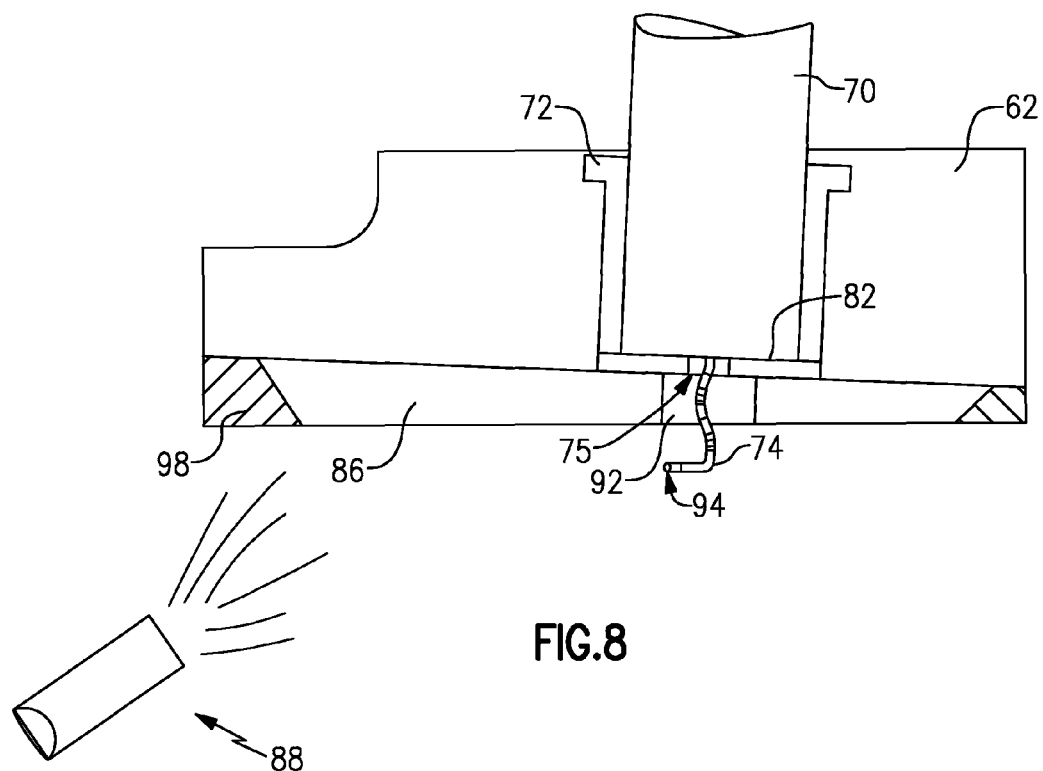
FIG. 8 is a cross-sectional view of an initial process of the example method of mounting a proximity sensor.

Referring to FIG. 7, a weld joint 84 is formed between the ferrule 72 and the case structure 62. The weld joint 84 may be formed utilizing any known welding or brazing process compatible with the materials of the ferrule 72 and case 62. Once the lead 70 and ferrule 72 are mounted within the opening 76, the sensor wire 74 is extended through the smaller opening 75 through the bottom surface 82. The sensor wire 74 is drawn out and extended out past the inner surface 80 of the case structure 62.

A base non-conductive layer 86 is applied to the inner surface 80 around the sensor wire 74. The example non-conductive material 86 is applied using a thermal spraying process schematically shown at 88. In this example, the thermal spraying process 88 is a plasma spray deposition process. However, other thermal spraying processes that are compatible with the material and the example method could also be utilized. Moreover, other coating processes such as vapor deposition, sputter deposition or other know coating, or deposition processes that apply a non-cured material to a surface that cures in place could be utilized and are within the contemplation of this disclosure. Moreover, the material can be of any composition compatible with the application environment. The coatings are disclosed as conductive or non-conductive and can include alloys compatible with the process utilized.

A mask 98 is disposed around the opening 76 to contain the local application of the base non-conductive material 86. The non-conductive material 86 is applied to the inner surface 80 of the case structure 62 with a free end 94 of the sensor wire 74 extending through an opening 92 in the non-conductive base layer 86.

Figure 9:
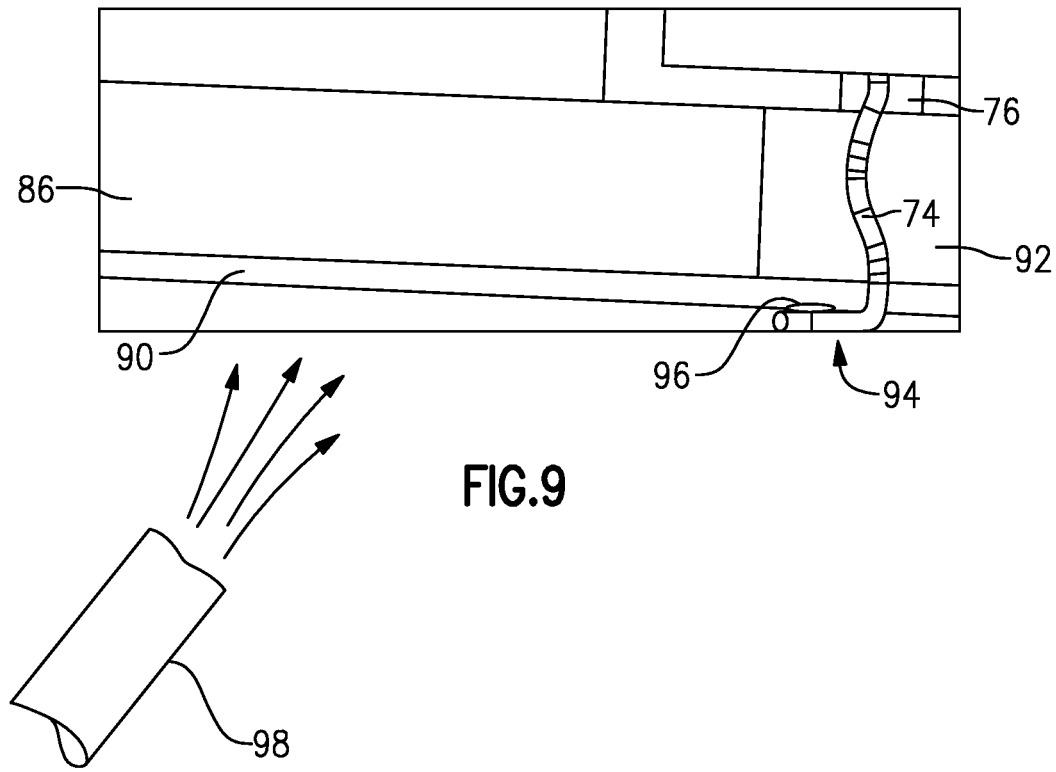
FIG. 9 is another cross-sectional view of a subsequent step for mounting the example proximity sensor.
Figure 10:
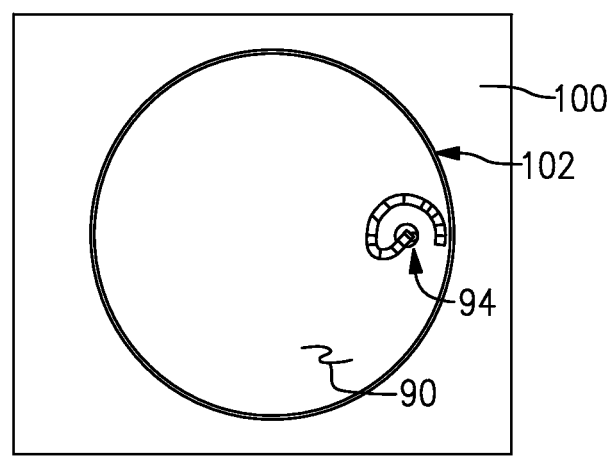
FIG. 10 is a plan view of the step of adhering a sensor wire to a conductive layer.

Referring to FIGS. 9 and 10, once the base non-conductive layer 86 has fully cured, a first conductive layer 90 is applied over the base non-conductive layer 86 utilizing a plasma spray deposition process schematically shown at 98. The plasma spray deposition process 98 provides for the deposition of conductive material in a non-cured state within an area defined by a mask 100. The mask 100 defines a surface area 102 for the conductive material 90.

Once the first layer of conductive material 90 has cured, the coiled end 94 of the sensor wire 74 is adhered to the first conductive layer 90. In this example, the coiled wire 94 is adhered through the use of an adhesive material 96. The adhesive material 96 is there to hold the sensor wire 74 for further processing. The adhesive 96 need not be of a composition intended to maintain the wire 74 throughout continued operation, but instead is utilized until a subsequent coating or material can be applied. The adhesive 96 is merely intended to maintain the coiled portion 94 in a desired position during further processing.

Figure 11:
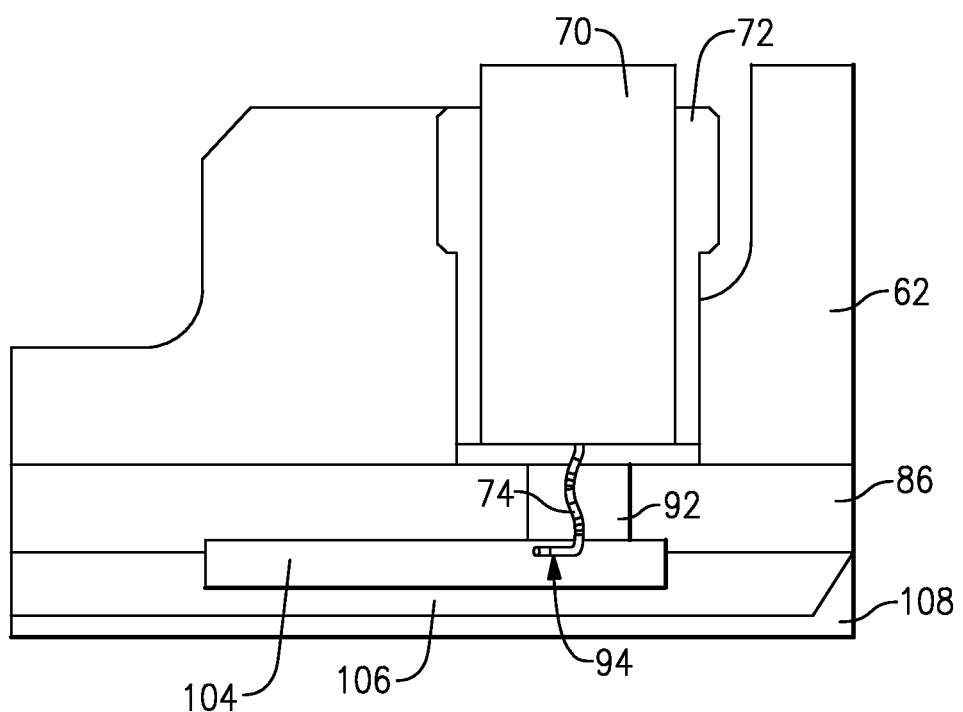
FIG. 11 is an example view of the step of encapsulating the sensor wire.

Referring to FIG. 11, once the adhesive 96 has cured and the sensor wire 74 secured in place on the first conductive layer 90, a second conductive layer 104 is applied over the first conductive layer 90 that encapsulates the sensor wire 74 and specifically the coiled end 94 of the sensor wire 74. The second conductive layer 104 is thicker and provides for the total encapsulation or covering of the coiled end 94 of the sensor wire 74 in conductive material. The interface between the coiled end 94 of the sensor wire 74 is electrically conductive such that the conductive and encapsulated layer 104 forms an electrically conductive bond and connection.

A mask 108 is also utilized in this step to define the outer bounds and shape of the conductive layer 104. Upon completion and curing of the conductive second layer 104 a cover non-conductive layer 106 is applied over the conductive layer 104. The mask 108 provides for a shaping and limiting of the amount of material that is required for covering the conductive material 104.

Figure 12:
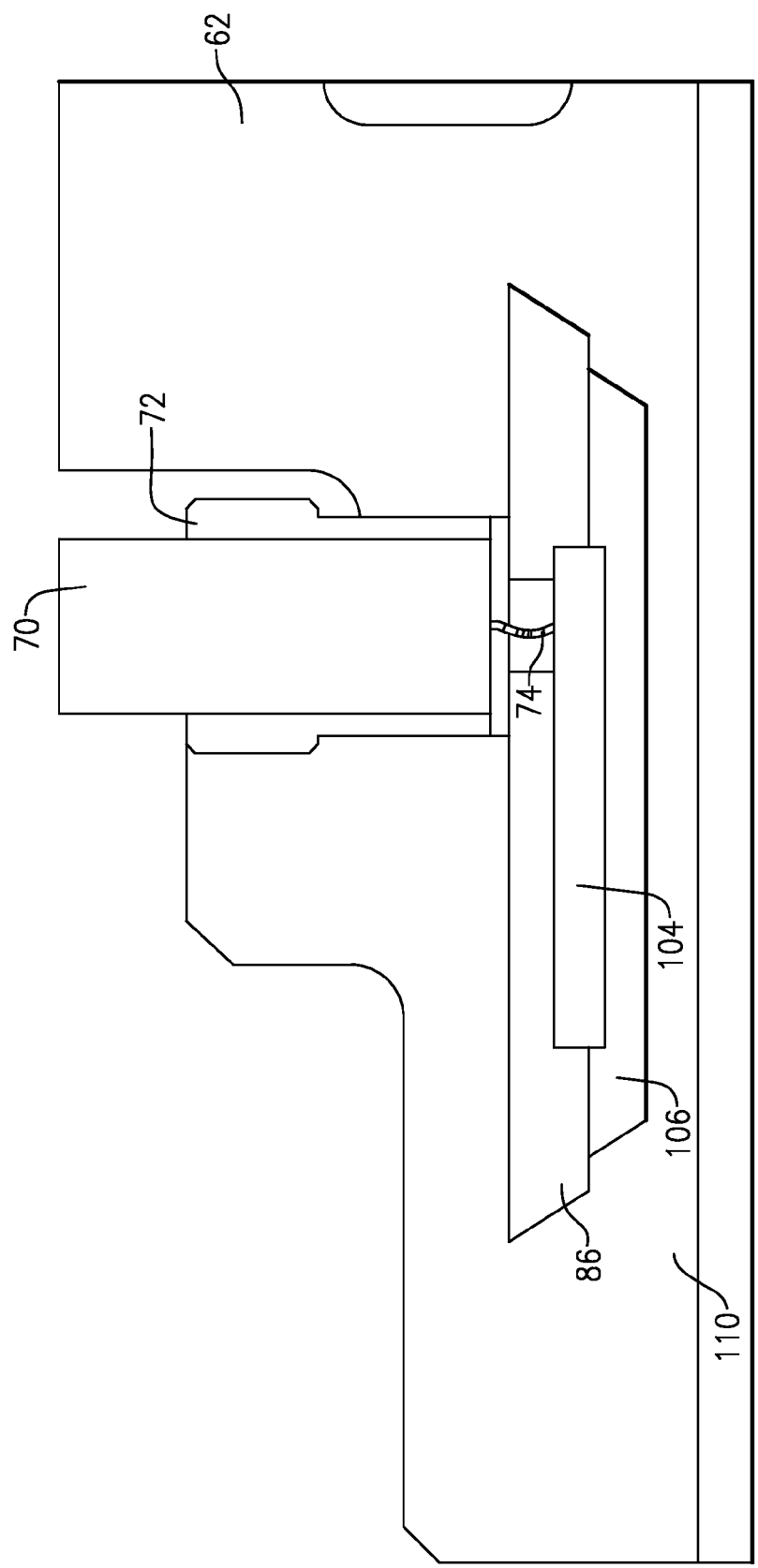
FIG. 12 is a cross-sectional view of the example proximity sensor prior to removing material to expose a sensor face.

Referring to FIG. 12, once the conductive layer 104 and cover non-conductive layer 106 has fully cured; an abraidable layer 110 may be applied also by a thermal deposition process. The abraidable layer 110 is a layer formed of material that is intended to cushion impacts that may occur between the static structure and rotating structures.

Figure 13:
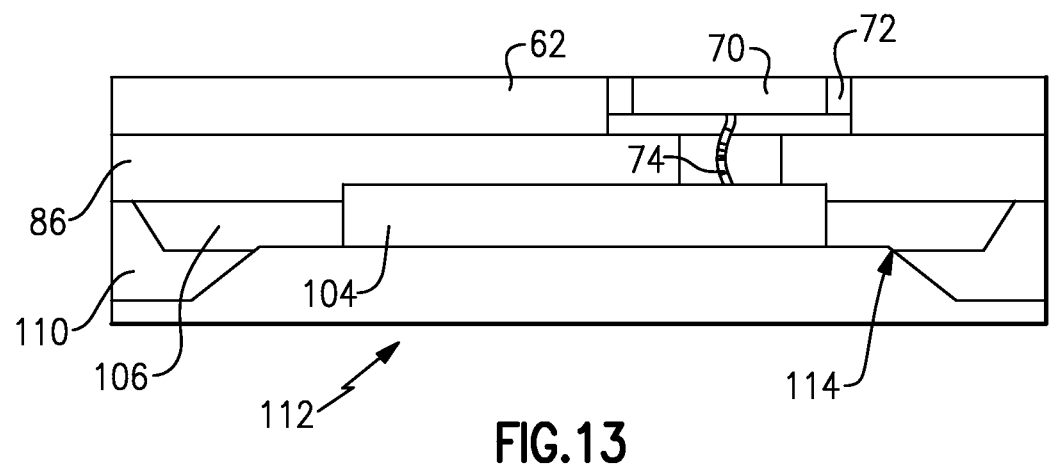
FIG. 13 is a cross-sectional view of the completed sensor assembly.
Figure 14:
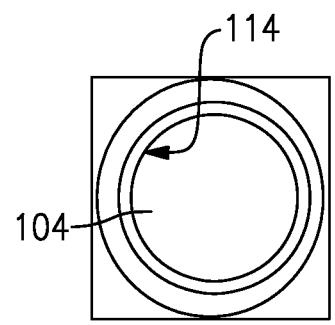
FIG. 14 is a plan view of the sensor had.

Referring to FIGS. 13 and 14, the sensor assembly 64 is completed by removing material to create a sensor opening 112 that exposes the conductive layer 104 that is in electric contact with the sensor wire 74. The opening 112 is machined through the abraidable layer 110 and a portion of the cover non-conductive layer 106 that surrounds the conductive layer 104.

In this example, the sensor shape 102 is formed in a circle and includes a chamfered or beveled portion 114 around the edges to provide a desired set back between the abraidable layer 110 and the sensing area 102 of the example proximity sensor 64.

In this example, the proximity sensor 64 is a capacitance probe that is utilized to detect the passing of the rotating blades relative to the fixed case structure 62. Sensing of the rotating structure is conducted through known capacitive sensing techniques to provide a means of measuring and determining blade health and therefore provide information that can reduce maintenance downtime.

The example method of forming an installing a capacitance proximity probe through the use of thermal deposition of conductive and non-conductive materials eliminates mounting complexities that limit the application of such proximity sensors. Moreover, the spray deposition techniques eliminate a risk of foreign object damage by eliminating loose parts of the sensor 64.

Although an example embodiment has been disclosed, a worker of ordinary skill in this art would recognize that certain modifications would come within the scope of this disclosure. For that reason, the following claims should be studied to determine the scope and content of this disclosure.

What is claimed is:

1. A method of fabricating a proximity sensor comprising:
   mounting a lead within an opening of a substrate;
   extending a sensor wire that extends from the lead through the opening in the substrate;
   depositing a base electrically non-conductive layer with a cure in place process onto the substrate and around the sensor wire;
   encapsulating the sensor wire within an electrically conductive layer deposited onto the base non-conductive layer with a cure in-place process, wherein an end of the sensor wire is held within the electrically conductive layer;
   applying a cover non-conductive layer over the conductive layer with a spray deposition process; and
   removing a portion of the non-conductive layer to expose a portion of the electrically conductive layer.

2. The method as recited in claim 1, wherein encapsulating the sensor wire within a conductive layer comprises depositing a first conductive layer onto the base non-conductive layer, adhering the sensor wire to the first conductive layer and depositing a second conductive layer over the first conductive layer and the sensor wire.

3. The method as recited in claim 1, including the step of masking an area for the base non-conductive layer and depositing non-conductive material within the masked area.

4. The method as recited in claim 1, including the step of defining a sensor area with a mask and depositing the conductive layer encapsulating the sensor wire within the sensor area.

5. A method of mounting a proximity sensor within a gas turbine engine comprising:
   forming an opening within a case structure proximate a rotating structure, wherein the opening is formed through an outer surface of the case structure and includes a bottom surface;
   mounting a lead into the opening;
   extending a sensor wire extending from the lead through a second opening through the bottom surface to an inner surface of the case structure;
   depositing a base non-conductive layer with a thermal spray process onto the inner surface of the case structure around the sensor wire;
   encapsulating the sensor wire within a conductive layer deposited onto the base non-conductive layer with a thermal spraying process;
   depositing a non-conductive abraidable layer over the conductive layer; and
   removing a portion of the abraidable layer to expose the conductive layer.

6. The method as recited in claim 5, including depositing a cover non-conductive layer over the conductive layer prior to depositing the abraidable layer and removing both the cover non-conductive layer and the abraidable layer to expose the conductive layer.

7. The method as recited in claim 5, wherein encapsulating the sensor wire within a conductive layer comprises depositing a first conductive layer onto the base non-conductive layer, adhering the sensor wire to the first conductive layer and depositing a second conductive layer over the first conductive layer and the sensor wire.

8. The method as recited in claim 5, including removing a portion of the abraidable layer to define a shape of the proximity sensor.

9. The method as recited in claim 5, wherein the thermal spraying process comprises a plasma deposition spray process.

10. The method as recited in claim 5, including mounting a lead within a ferrule and mounting the ferrule to the case structure proximate the opening.

11. The method as recited in claim 10, including brazing the lead to the ferrule and welding the ferrule to the case structure.

12. A proximity sensor comprising:
   a lead supported within an opening through an outer surface of a case structure, the opening including a bottom surface;
   a sensor wire extending from the lead through a second opening through the bottom surface to an inner surface of the case structure;
   a base non-conductive layer thermally applied to the inner surface of the case structure around the sensor wire;

a conductive layer thermally deposited onto the base non-conductive layer and encapsulating the sensor wire; and a cover non-conductive layer thermally deposited over portions of the conductive layer such that an area of the conductive layer is exposed to define a sensor area.

13. The proximity sensor as recited in claim 12, wherein the conductive layer comprises a first conductive layer applied to the base non-conductive layer, wherein the sensor wire is adhered to the first conductive layer and a second conductive layer encapsulating the sensor wire adhered to the first conductive layer.

14. The proximity sensor as recited in claim 13, wherein the sensor wire is in electrical conductive contact with the conductive layer.

15. The proximity sensor as recited in claim 12, including a ferrule supporting the lead and attached to the case structure.

16. The proximity sensor as recited in claim 15, including an abraidable layer deposited over the cover non-conductive layer and the conductive layer is exposed and countersunk relative to the abraidable area.

\* \* \* \* \*

UNITED STATES PATENT AND TRADEMARK OFFICE
CERTIFICATE OF CORRECTION

PATENT NO. : 9,726,777 B2
APPLICATION NO. : 14/761994
DATED : August 8, 2017
INVENTOR(S) : Eli Cole Warren and Jerusalem Nagash It is certified that error appears in the above-identified patent and that said Letters Patent is hereby corrected as shown below:

On the Title Page

In Column 1, item (72), Inventors; replace "Jerusalem Negash" with --Jerusalem Nagash--

Signed and Sealed this
Twenty-eighth Day of August, 2018

Andrei Iancu
*Director of the United States Patent and Trademark Office*